(12) United States Patent
Rategh et al.

(10) Patent No.: US 6,760,900 B2
(45) Date of Patent: Jul. 6, 2004

(54) INTEGRATED CIRCUITS WITH SCALABLE DESIGN

(75) Inventors: Hamid Reza Rategh, Cupertino, CA (US); Mehdi Frederik Soltan, Stanford, CA (US)

(73) Assignee: Anadigics Inc., Warren, NJ (US)

( * ) Notice: Subject to any disclaimer, the term of this patent is extended or adjusted under 35 U.S.C. 154(b) by 52 days.

(21) Appl. No.: 10/004,976

(22) Filed: Dec. 3, 2001

(65) Prior Publication Data

US 2003/0106038 A1 Jun. 5, 2003

(51) Int. Cl.⁷ ............................................. G06F 17/50
(52) U.S. Cl. ........................... 716/19; 716/10; 716/11; 716/18
(58) Field of Search ................. 716/19–21, 1, 716/2, 3, 4, 5, 8, 9, 10, 11, 12, 13, 14, 18

(56) References Cited

U.S. PATENT DOCUMENTS 5,598,344 A * 1/1997 Dangelo et al. ............... 716/18
5,754,826 A * 5/1998 Gamal et al. .................. 703/14

OTHER PUBLICATIONS

Baghai et al., "Challanges in CMOS Mixed–Signal Designs for Analog Circuit Designers," 1997 Proceedings 40th Midwest Symposium on Circuits & Systems, pp. 47–50.*

Berkcan et al., "Physical Assembly for Analog Compilation of High Voltage ICs," IEEE 1988 Custom ICs Conference, pp. 14.3.1–14.3.7.*

* cited by examiner

*Primary Examiner*—Leigh M. Garbowshi
(74) *Attorney, Agent, or Firm*—H. Black P.E.

(57) ABSTRACT

A method for designing at least one mask for manufacturing an integrated circuit is disclosed. The method may include generating a schematic; entering data representing transistors of the set into a computer-aided design system; identifying transistors expected to be subject to voltage levels beyond the bounds of a power rail and a ground rail; designating robust geometries such transistors and operating the computer-aided design system to generate mask or masks. Integrated circuits of scalable design are also disclosed.

8 Claims, 3 Drawing Sheets

INTEGRATED CIRCUITS WITH SCALABLE DESIGN

TECHNICAL FIELD OF THE INVENTION

The invention relates generally to analog or hybrid integrated circuits. The invention more particularly relates to design methodologies that facilitate migrating designs for such circuits to different feature size technologies.

BACKGROUND

Lithography, such as electron beam lithography, is well known in the MOS (metal oxide semiconductor) arts. Progressively higher component densities have been achieved over time by printing progressively smaller features upon semiconductor wafers. This trend of scaling down is expected to continue for some time. Generally, the width of the smallest allowable feature, such as a conductive track, is quoted to specify a particular scaling and a set of design rules corresponding thereto is created. Or, equivalently the Lambda may be cited. The use of the Lambda parameter is well known in the semiconductor manufacturing arts. Thus, CMOS (complementary MOS) design rules for printing features as small as 0.35 microns (micrometer) are referred to as "0.35 micron design rules". Over time, design rules have evolved from 0.35 micron to 0.25, 0.18, 0.13, 0.08 micron and beyond. Also, over time, there is a trend to use lower powers and operating voltages. Design rules may specify many things, for example, upper and lower bounds for feature dimensions and for voltages. In particular, they specify, amongst other things, the minimum required size of and spacing between particular features, depending upon the power supply and signal voltages to be used.

MOS processes and corresponding design rules have primarily been used for creating digital micro-circuits. Automated design systems for schematic capture, layout and mask generation for digital chips are available and incorporate design rules appropriate to the targeted manufacturing process. Typically, in digital chips, only those transistors that interface to external (off-chip) circuits experience glitches or other large voltage excursions. The transistors that interface off-chip are designated IO transistors (input-output transistors). Such designation, within an automated design system, permits an automated layout generator to follow design rules for features that will withstand the wider voltage specifications necessary (or merely desirable) in dealing with circuit features that conduct off-chip.

MOS processes are also used for analog designs including hybrid micro-circuit designs. Hybrid micro-circuit designs are mixed inter-operating digital and analog circuits sharing a single die. A typical hybrid design is a RF (radio frequency) transceiver circuit incorporating digital signal processing. In MOS analog designs there are design problems not ordinarily found in digital designs and consequently analog designs may not generally be considered to be scalable, i.e., manual conversion and layout of some circuit features are required when migrating to a smaller feature technology. This occurs for multiple reasons. Intentional operation in a triode region and corresponding biasing requirements may be one such reason. Another is that in analog microcircuits, transistors that are not IO transistors may be subject to large voltage excursions, for example, due to insufficient isolation from an IO transistor or due to standing wave collision.

Thus, a need exists to improve the scalability of analog and hybrid MOS design methods, and for MOS chips with reduced overall product cycle costs pursuant to such methods.

SUMMARY OF THE INVENTION

According to a first aspect of the invention, a method for designing IC masks is disclosed. The method may involve generating a schematic, entering transistor data into a CAD system, identifying the I/O transistors and/or the high voltage transistors, designating robust geometries for, and generating the masks.

According to a further aspect of the invention, an integrated circuit comprising a metal oxide semiconductor die formed by lithography using at least one mask is disclosed. The at least one mask may be designed by methods according to the first aspect of the invention.

BRIEF DESCRIPTION OF DRAWINGS

For simplicity in description, identical components are labeled by identical numerals in this document.

DETAILED DESCRIPTION

Figure 1:
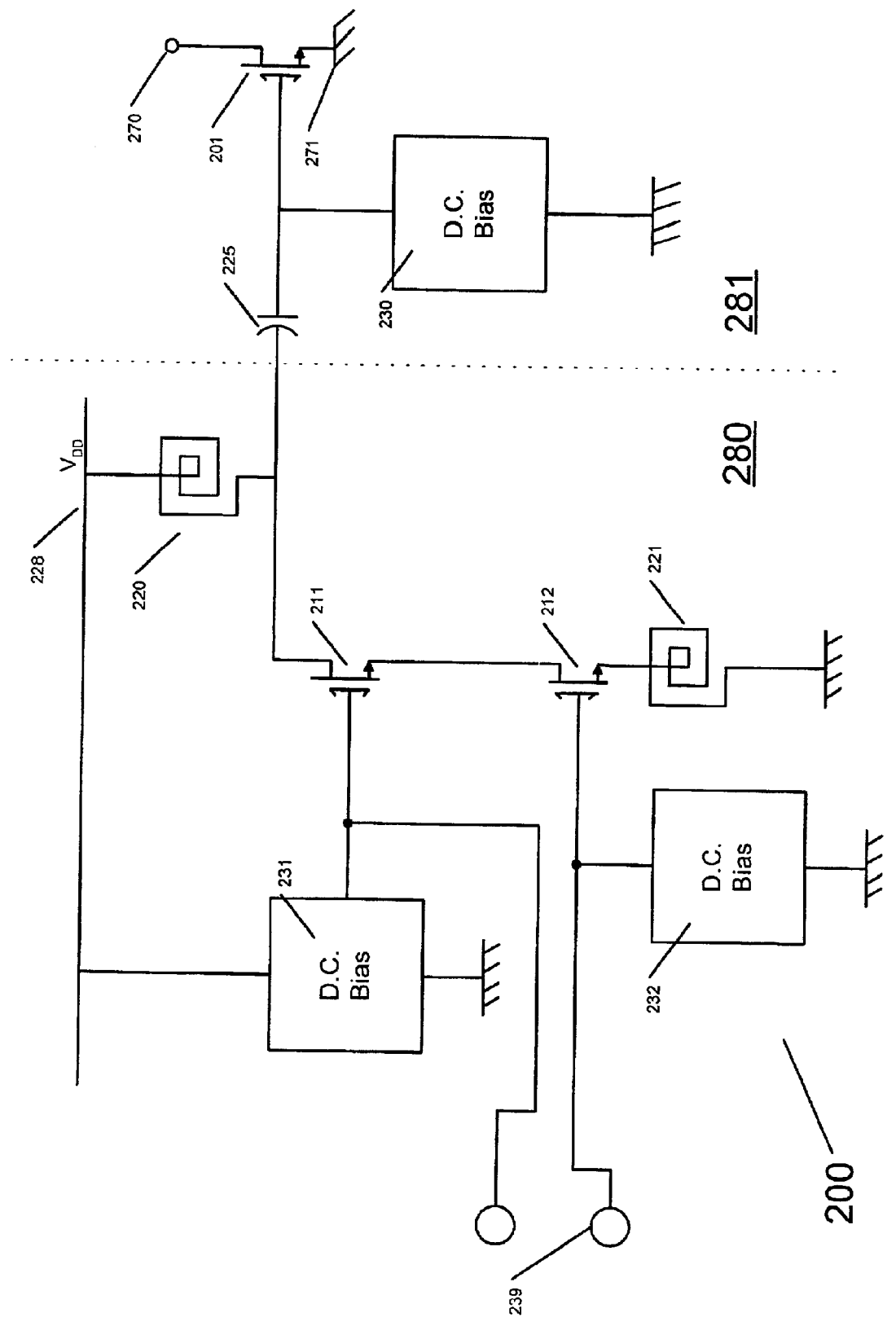
FIG. 1 shows a schematic diagram, in partial block diagram of part of an IC (integrated circuit) according to an embodiment of the invention.

In the following description, for purposes of clarity and conciseness of the description, not all of the numerous components shown in the schematic are described. The numerous components are shown in the drawings to provide a person of ordinary skill in the art a thorough enabling disclosure of the present invention. The operation of many of the components would be understood and apparent to one skilled in the art.

FIG. 1 is a schematic diagram, in partial block diagram of part of an IC 200 according to an embodiment of the invention. As shown, IC 200 implements an analog RF PA (power amplifier) circuit. As a power amplifier, IC 200 may produce relatively high power levels such as might typically be needed in connection with a transmitter driving a radiating antenna. IC 200 comprises output stage 281 and driver stage 280. IC 200 may be implemented or incorporated as part of a semiconductor chip using well known technologies such as MOS (metal-oxide semiconductors). NMOS transistors (n-channel metal-oxide semiconductor field-effect transistors) are shown in the circuit but their use is exemplary only and comparable circuits may be constructed using PMOS transistors (p-channel metal-oxide semiconductor field-effect transistors), BJTs (Bipolar junction transistors) or other active solid state devices within the scope of the invention.

In output stage 281 of IC 200, NMOS transistor 201 is an IO (input/output) transistor and may function as an output stage amplifier. IO transistors are well known in the relevant arts and are characterized by their relatively high breakdown voltage and large geometries. Transistor 201 operates between output port 270 and output ground 271. Output port 270 may provide load (not shown) and bias current and will also typically connect to a matching network (not shown) for matching load impedance to output impedance. DC (direct current) bias circuit 230 provides offset bias for the gate of transistor 201. In certain embodiments, transistor 201 operates as an amplifier in the triode region as a class A amplifier. Coupling capacitor 225 couples a RF signal into the output stage 281. Capacitor 225 may be embodied as an on-chip capacitor formed by, for example, well-known MOS processes. Only a small capacitor may be required, for example, at 2 GHz (gigahertz) a 1 pF (picofarad) capacitor has a susceptance of approximately+10S (siemens, leading).

In driver stage 280, transistor 211 may operate in common gate mode; the gate bias for transistor 211 is set by DC Bias circuit 231. Inductor 220 connects a DC power supply ($V_{DD}$) rail to drain of transistor 211. Inductor 220 may block RF signals from entering the power supply rail 228 and acts in conjunction with capacitor 225 and inductor 221 to provide inter-stage matching for the RF signal. Inductors 220 and 221 may be implemented as on-chip spiral conductors with suitable inductance and Q values according to techniques well known in the art.

Transistor 212 may operate in common source mode and is grounded via inductor 221. Transistor 212 is biased by DC circuit 232 into a triode region thus providing considerable current gain. Thus, transistors 211, 212 operate together in a cascode arrangement. Cascode arrangements are well known in the art. Since transistor 211 operates in common gate mode, it has unity current gain but provides a large power gain. Thus, the cascode arrangement provides good isolation, and thus prevents signal from back feeding into the input port 239 from output port 270. Moreover, the cascode arrangement provides increased electrical stability. In a typical embodiment the input port 239 may connect to a combination of digital and analog circuits which may be complex including a large number of transistors if, for example, digital signal processing is to be performed.

Figure 2:
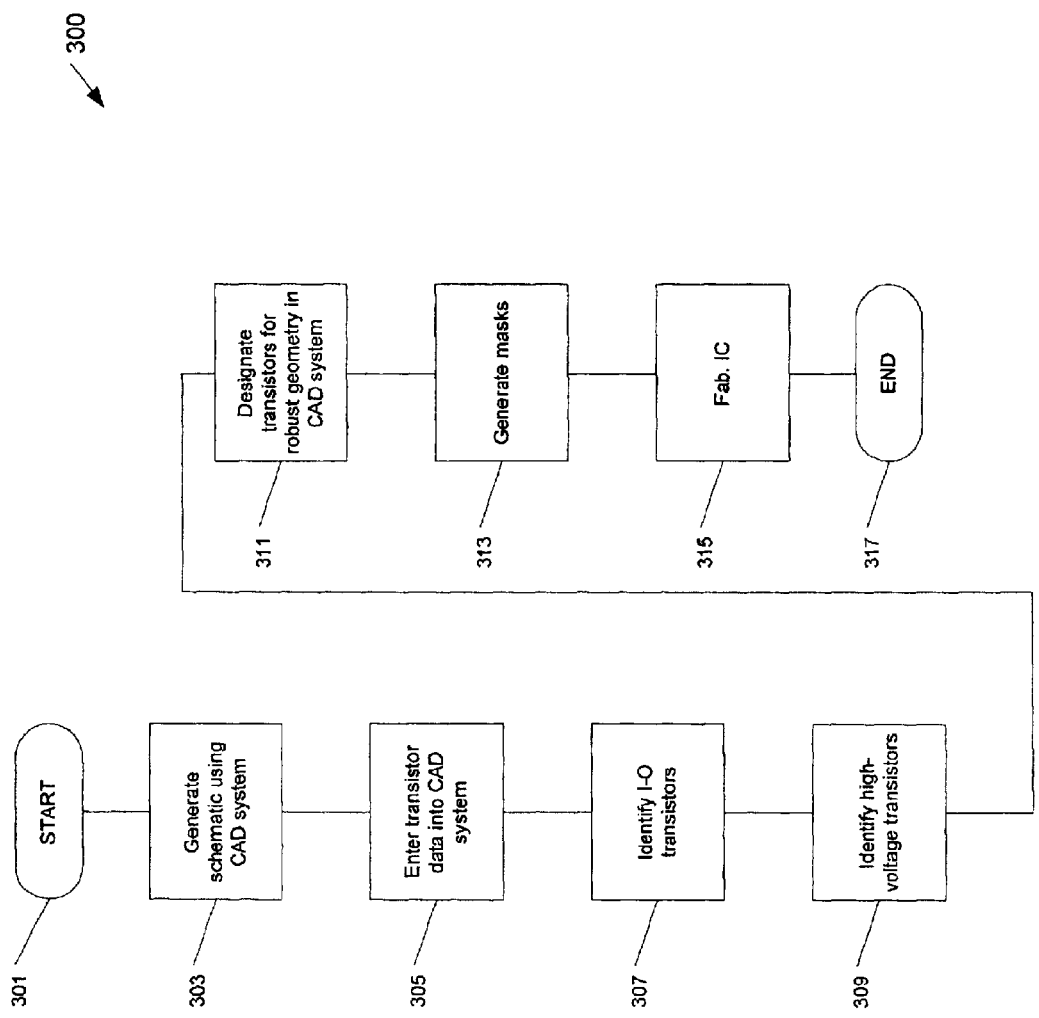
FIG. 2 is a flow diagram of a method for designing and constructing an IC according to an embodiment of the invention.

FIG. 2 is a flow diagram of a method 300 for designing and constructing an IC according to an embodiment of the invention. In box 301 a method 300 is started.

In box 303 a CAD (computer aided design) system is used to generate a schematic representing the target or desired circuit. Data, such as device identifiers, parameters and netlists are used to store the schematic in computer intelligible form. CAD systems for designing ICs are well known in the art. In box 305 transistor data is entered into the CAD system. This data may include, for example, finger numbers for multiple finger transistors. In box 307 the IO transistors are identified, IO transistors are ones which are connected externally to off-chip elements (other than power supply or ground rails) and which are connected directly or through passive devices only. In box 309 the high-voltage transistors are identified. These are transistors that may reasonably be subjected to voltage swings outside the power rails in normal operation. For example, in the RF PA of FIG. 1, the cascode transistor may be subject to voltage swings due to its inductive load, which allows voltage swings outside the limits of $V_{DD}$ and ground.

In box 311 the transistors identified as either IO transistors or high-voltage transistors are designated for robust geometry in the CAD system data. When generated into a layout and then into mask(s), such transistors will have high-voltage features such as gate/drain isolation. Robust geometry transistors may not be scaled down when migrating a chip design across features technologies for progressive miniaturization. This use of the same geometry across feature technologies maintains the necessary high voltage operation. Consequently, analog circuits—especially RF circuits which may have critical effects such as high voltages arising from imperfect isolation, transmission lines effects, etc.—may be scaled to new line width technologies with relative ease. Next, in box 313 lithography masks are generated using the CAD system and in box 315 the IC is fabricated using ordinary semiconductor manufacturing processes. The method 300 ends at box 317.

IO devices such as those that may be used for output transistor 201 are well known in MOS digital circuits and other digital technologies in which they are typically used to buffer signals to and/or from off-chip circuits, thereby providing a measure of protection against voltage spikes. Voltage spikes may be caused by multiple reflections of signals at impedance discontinuities. High breakdown IO devices are provided in industry standard sub-micron CMOS processes such as those using 0.35 micron, 0.25 micron, 0.18 micron and 0.13 micron design rules. As designs are progressively adapted for smaller and smaller design rules, 10 devices scale differently (or not at all) as compared to regular devices. Thus, the use of an IO transistor as an output stage transistor permits scaling of RFICs (radio frequency integrated circuits) with repeatability, while sustaining power levels and keeping the peak signal below the limit specified by the appropriate design rule. Such scalability is achieved without compromising high volume, high yield manufacturing of small or very small chips. Miniaturization is advantageous, especially in applications involving harsh physical or electromagnetic environments.

Figure 3:
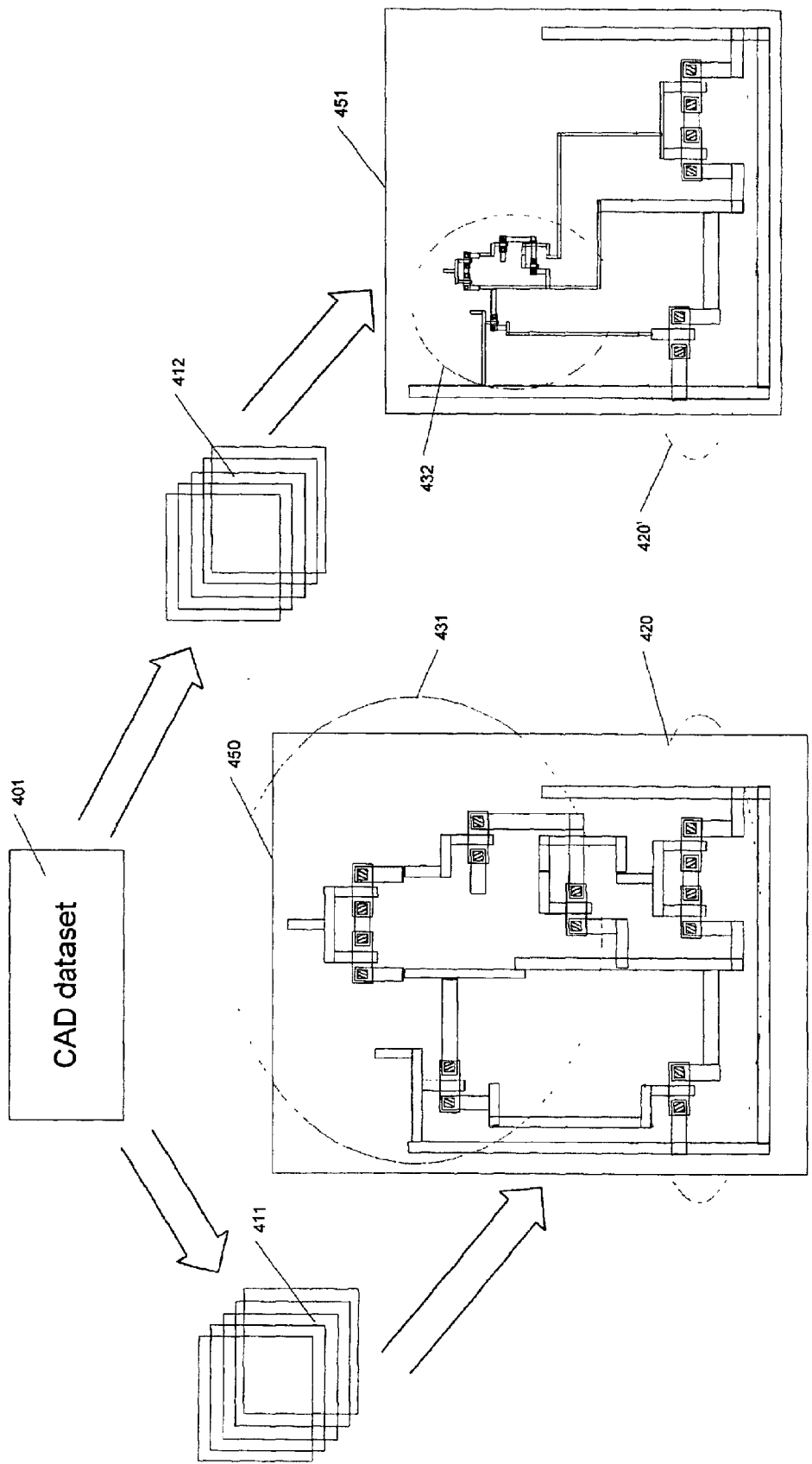
FIG. 3 shows a dataset and two sets of masks and two semiconductor dice.

FIG. 3 shows a CAD dataset 401, two sets of masks 411, 412 and two semiconductor dice 450, 451. The two sets of masks 411, 412 are produced from a common CAD dataset 401 using two mutually different feature size design rules. Die 450 is produced using large feature size design rules than die 451 and consequently die 450 is typically larger than die 451. The robust geometry transistor semiconductor features 420, 420' are similar or substantially the same on both dice 450, 451. The transistor features 431, 432 for transistors other than robust geometry transistors are greatly different in size between the two dice 450, 451.

Embodiments of the invention as described herein have significant advantages over previously developed implementations. As will be apparent to one of ordinary skill in the art, other similar circuit arrangements are possible within the general scope of the invention. The embodiments described above are intended to be exemplary rather than limiting and the bounds of the invention should be determined from the claims.

What is claimed is:

1. A method for designing at least one mask for manufacturing an integrated circuit comprising:

generating a schematic for the integrated circuit, the integrated circuit comprising a set of transistors;

entering data representing each transistor of the set into a computer-aided design system;

identifying a first subset of the set of transistors implementing an analog circuit comprising a cascode wherein the transistors of the first subset are expected to be subject to voltage levels beyond the bounds of a power rail and a ground rail of the integrated circuit during normal operation;

designating, in the computer-aided design system, robust geometries for the transistors of the first subset; and operating the computer-aided design system to generate the at least one mask.

2. The method of claim 1 further comprising:

identifying a second subset of the set of transistors, wherein the transistors of the second subset are input-output transistors and designating, in the computer aided design system, robust geometries for the transistors of the second subset.

3. An integrated circuit comprising:

a semiconductor die formed using at least one mask designed by the acts of:
- generating a schematic for the integrated circuit, the integrated circuit comprising a set of transistors;
- entering data representing each transistor of the set into a computer-aided design system;
- identifying a first subset of the set of transistors implementing an analog circuit comprising a cascode wherein the transistors of the first subset are expected to be subject to voltage levels beyond the bounds of a power rail and a ground rail of the integrated circuit during normal operation;
- designating, in the computer-aided design system, robust geometries for the transistors of the first subset, such that the set of data may be used to generate a plurality of masks for lithography of features having mutually different minimum line widths.

4. The integrated circuit of claim 3 wherein:

the at least one mask is designed by acts further comprising:
- identifying a second subset of the set of transistors, wherein the transistors of the second subset are input-output transistors and
- designating, in the computer aided design system, robust geometries for the transistors of the second subset.

5. The integrated circuit of claim 3 wherein:

the integrated circuit implements a radio frequency circuit.

6. The integrated circuit of claim 3 wherein:

the integrated circuit implements a hybrid circuit.

7. The integrated circuit of claim 3 wherein:

the semiconductor die comprises metal-oxide transistors is formed using lithography.

8. A method for designing a plurality of masks for manufacturing an integrated circuit migrated across a plurality of feature size technologies, each mask associated with a respective feature size technology, the method comprising:
- generating a schematic for the integrated circuit, the integrated circuit comprising a set of transistors;
- entering data representing each transistor of the set into a computer-aided design system;
- identifying a first subset of the set of transistors implementing an analog circuit comprising a cascode wherein the transistors of the first subset are expected to be subject to voltage levels beyond the bounds of a power rail and a ground rail of the integrated circuit during normal operation;
- designating, in the computer-aided design system robust geometries for the transistors of the first subset; and
- operating the computer aided design system to generate a first mask associated with a first feature size technology and a second mask associated with a second feature size technology, wherein a respective geometry of each transistor of the first subset is the same for both the first mask and the second mask.

* * * * *